US012647087B2

(12) United States Patent
Toumori

(10) Patent No.: US 12,647,087 B2
(45) Date of Patent: Jun. 2, 2026

(54) FILTER DEVICE

(71) Applicant: Murata Manufacturing Co., Ltd.,
Kyoto (JP)

(72) Inventor: Masashi Toumori, Kyoto (JP)

(73) Assignee: Murata Manufacturing Co., Ltd.,
Kyoto (JP)

( * ) Notice: Subject to any disclaimer, the term of this
patent is extended or adjusted under 35
U.S.C. 154(b) by 206 days.

(21) Appl. No.: 18/432,594

(22) Filed: Feb. 5, 2024

(65) Prior Publication Data

US 2024/0333245 A1 Oct. 3, 2024

(30) Foreign Application Priority Data

Mar. 29, 2023 (JP) ................................. 2023-053744

(51) Int. Cl.
| *H03H 7/01* | (2006.01) |
| *H01P 1/20* | (2006.01) |
| *H05K 1/02* | (2006.01) |
| *H01F 17/00* | (2006.01) |

(52) U.S. Cl.
CPC ............. *H03H 7/0115* (2013.01); *H01P 1/20*
(2013.01); *H05K 1/0233* (2013.01); *H01F*
*2017/0026* (2013.01)

(58) Field of Classification Search
CPC ...... H01P 1/20; H03H 7/0115; H03H 7/1766;
H01F 2017/0026; H05K 1/0233
USPC ........................................................ 333/165
See application file for complete search history.

(56) References Cited

U.S. PATENT DOCUMENTS

| | | | | |
|---|---|---|---|---|
| 2007/0069835 | A1* | 3/2007 | Kamgaing ............... | H03H 5/02 |
| | | | | 333/185 |
| 2008/0169883 | A1* | 7/2008 | Hsu .......................... | H03H 5/00 |
| | | | | 333/185 |
| 2015/0357989 | A1 | 12/2015 | Ma et al. | |
| 2016/0344353 | A1* | 11/2016 | Watts ...................... | H03F 1/565 |
| 2019/0123552 | A1* | 4/2019 | Nakaiso ................. | H02H 9/045 |
| 2021/0391841 | A1* | 12/2021 | Toujo ...................... | H01L 23/12 |
| 2022/0037754 | A1* | 2/2022 | Jian .......................... | H01P 1/20 |

FOREIGN PATENT DOCUMENTS

JP 2017-501658 A 1/2017

\* cited by examiner

*Primary Examiner* — Andrea Lindgren Baltzell
*Assistant Examiner* — Victor Cole
(74) *Attorney, Agent, or Firm* — McDonald Hopkins LLC

(57) ABSTRACT

A filter device includes an inductor component, and a substrate on which the inductor component is mounted, the substrate including a first dielectric layer having a mounting surface, a first pad electrode, which is provided on the mounting surface and to which a first terminal of the inductor component is connected, and a first electrode, which is connected and is provided such that the first dielectric layer is positioned between the first electrode and the first pad electrode. At least part of the first electrode overlaps the first pad electrode when the mounting surface is viewed in a plan view. The first pad electrode and the at least part of the first electrode form a first capacitor.

11 Claims, 12 Drawing Sheets

FILTER DEVICE

CROSS REFERENCE TO RELATED APPLICATION

This application claims priority from Japanese Patent Application No. 2023-053744 filed on Mar. 29, 2023. The content of this application is incorporated herein by reference in its entirety.

BACKGROUND OF THE DISCLOSURE

1. Field of the Disclosure

The present disclosure relates to a filter device.

2. Description of the Related Art

There is a broadband harmonic trap including LC circuits (for example, see Japanese Unexamined Patent Application Publication (Translation of PCT Application) No. 2017-501658).

BRIEF SUMMARY OF THE DISCLOSURE

In a case where the constituent components of the broadband harmonic trap described in Japanese Unexamined Patent Application Publication (Translation of PCT Application) No. 2017-501658 are to be realized by surface mount devices (SMDs) or wiring lines on a substrate, the size of the device will become large, which is not desirable.

The present disclosure has been made in light of such circumstances and aims to provide filter devices that can be reduced in size.

A filter device according to an aspect of the present disclosure includes an inductor component, and a substrate on which the inductor component is mounted, the substrate including a first dielectric layer having a mounting surface, a first pad electrode, which is provided on the mounting surface and to which a first terminal of the inductor component is connected, and a first electrode, which is connected and is provided such that the first dielectric layer is positioned between the first electrode and the first pad electrode. At least part of the first electrode overlaps the first pad electrode when the mounting surface is viewed in a plan view. The first pad electrode and the at least part of the first electrode form a first capacitor.

According to the present disclosure, filter devices that can be reduced in size can be provided.

BRIEF DESCRIPTION OF THE SEVERAL VIEWS OF THE DRAWINGS

FIG. 9 is a circuit diagram of a filter circuit 24;

DETAILED DESCRIPTION OF THE DISCLOSURE

In the following, embodiments of the present disclosure will be described in detail with reference to the drawings. Note that identical elements are denoted with identical symbols, and redundant description will be omitted as much as possible.

First Embodiment

Figure 1:
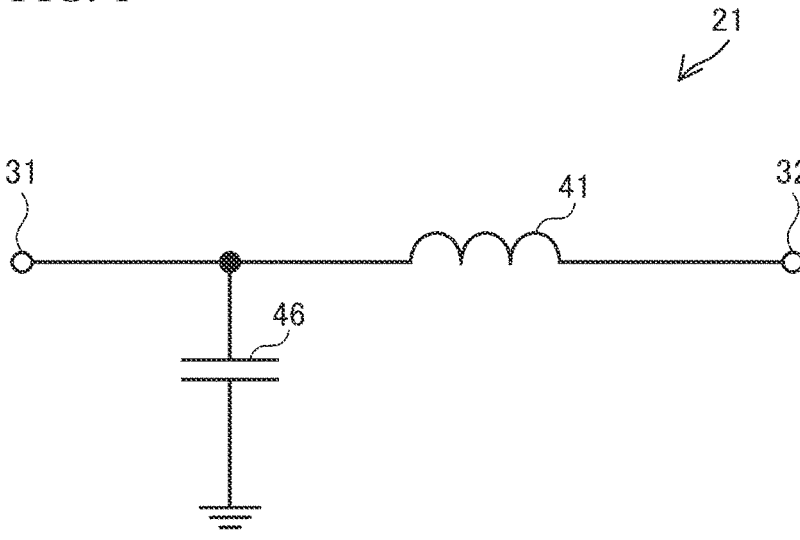
FIG. 1 is a circuit diagram of a filter circuit 21.

A filter circuit 21 and a filter device 11 according to a first embodiment will be described. FIG. 1 is a circuit diagram of the filter circuit 21. As illustrated in FIG. 1, the filter circuit 21 includes an inductor 41 and a capacitor 46 (a first capacitor).

The filter circuit 21 is, for example, provided downstream of a power amplification circuit that amplifies a radio frequency (RF) signal. The filter circuit 21 allows, for example, the fundamental wave of the RF signal to pass therethrough and suppresses the passage of the harmonics of the RF signal.

The inductor 41 of the filter circuit 21 has a first end connected to an input terminal 31, and a second end connected to an output terminal 32. The capacitor 46 has a first end connected to the input terminal 31, and a second end connected to ground.

In each drawing, the x axis, the y axis, and the z axis may be illustrated. The x axis, the y axis, and the z axis form a three-dimensional right-handed Cartesian coordinate system. In the following, the direction of the arrow along the x axis may be called the +x axis side, and the direction opposite to the arrow may be called the −x axis side. The same applies to the other axes. Note that the +z axis side and the −z axis side may be called "upper side" and "lower side", respectively. Moreover, the z axis direction may be called "stacking direction". In addition, a plane orthogonal to the x axis, a plane orthogonal to the y axis, or a plane orthogonal to the z axis may be called an yz plane, a zx plane, or an xy plane, respectively.

Figure 2:
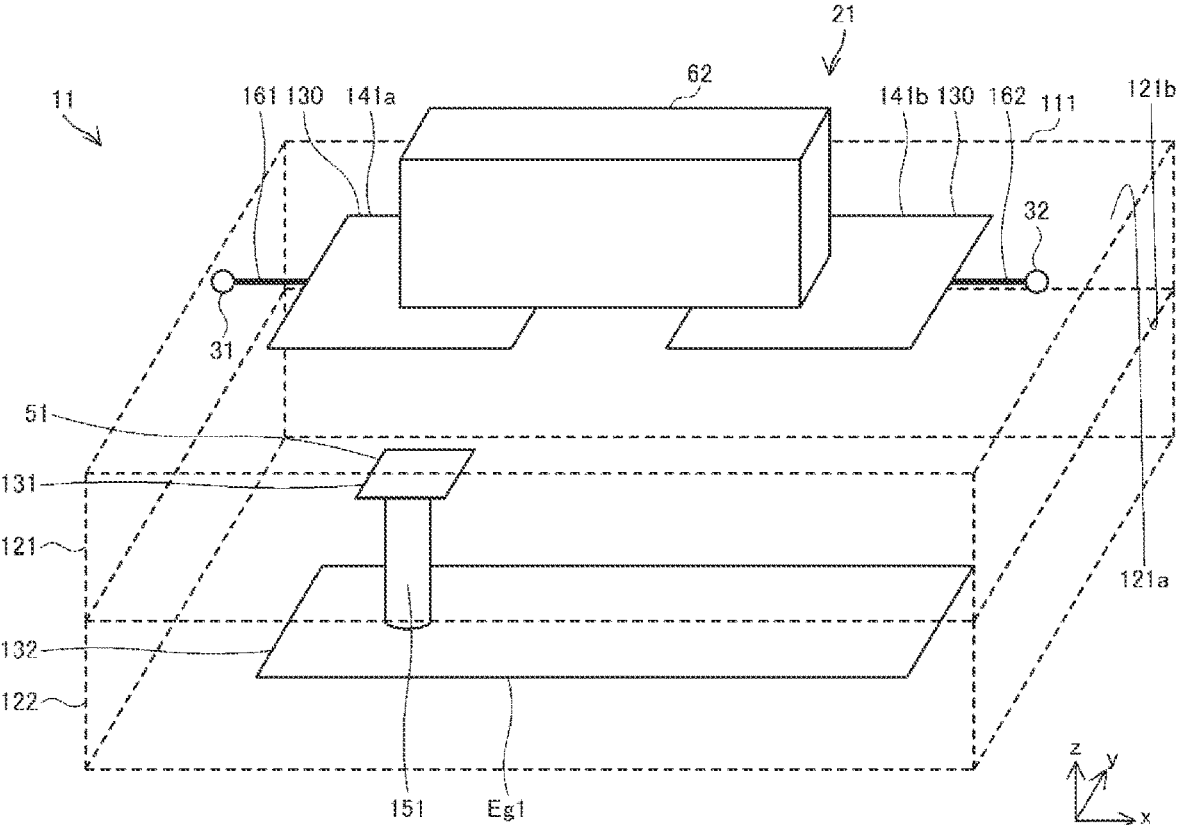
FIG. 2 is a perspective view schematically illustrating a filter device 11.
Figure 3:
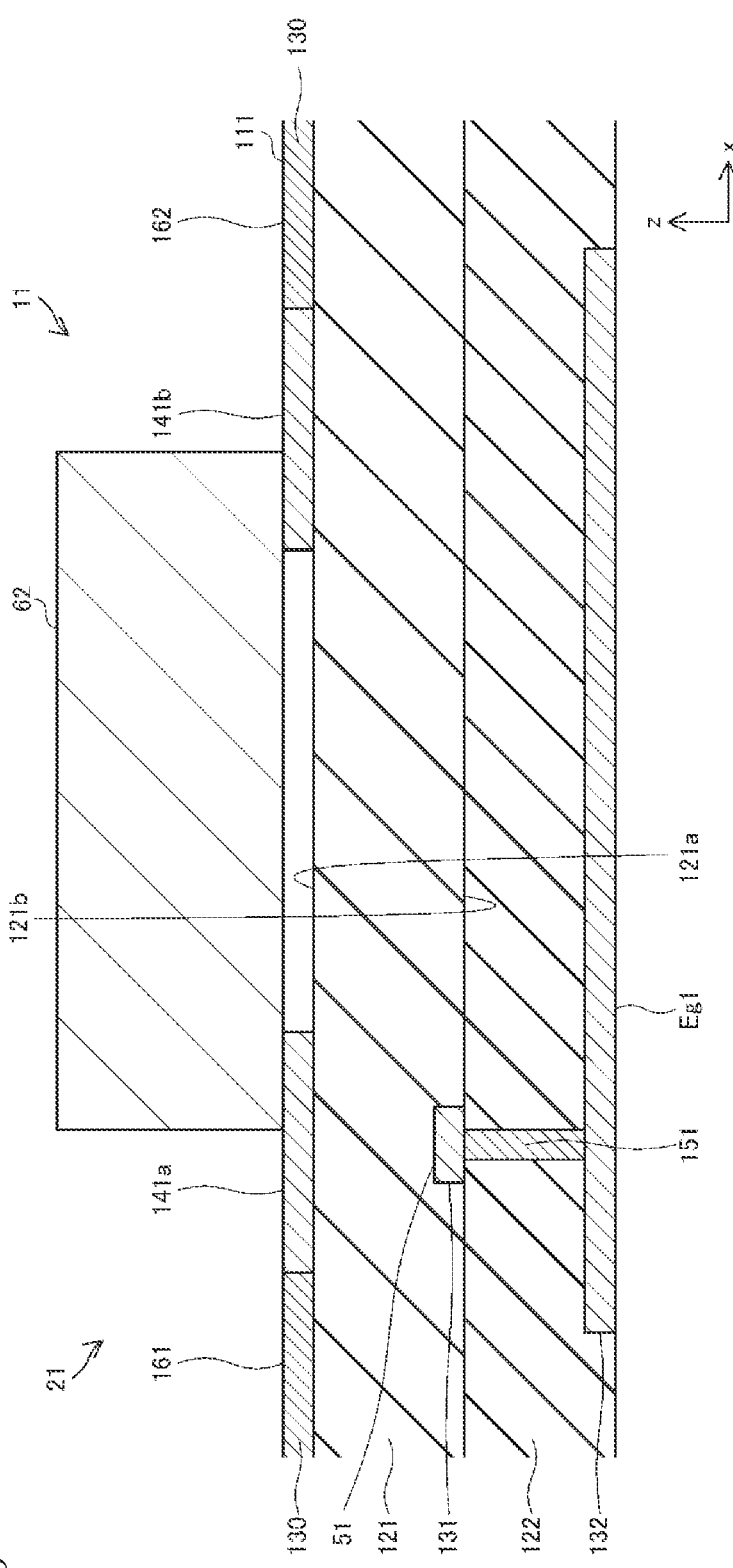
FIG. 3 is a cross-sectional view schematically illustrating a cross section parallel to the zx plane of the filter device 11.

FIG. 2 is a perspective view schematically illustrating the filter device 11. FIG. 3 is a cross-sectional view schematically illustrating a cross section parallel to the zx plane of the filter device 11. As illustrated in FIGS. 2 and 3, the filter device 11 includes an inductor component 62 and a multi-layer substrate 111. In the filter device 11, the filter circuit 21 is formed.

As illustrated in FIGS. 1 and 2, the multilayer substrate 111 includes a dielectric layer 121 (a first dielectric layer), a dielectric layer 122 (a second dielectric layer), metal layers 130, 131 (a first wiring layer), and 132 (a second wiring layer), and a via 151 (a first via).

The inductor component 62 is a surface mount device (SMD) mounted on the multilayer substrate 111. The inductor component 62 is, for example, a radio frequency component used for RF signals and functions as the inductor 41 of the filter circuit 21.

The inductor component 62 has a first terminal corresponding to the first end of the inductor 41, and a second terminal corresponding to the second end of the inductor 41.

The dielectric layers 121 and 122 of the multilayer substrate 111 are formed using, for example, pre-preg. The dielectric layer 121 has an upper surface 121a (a mounting surface), namely the surface on the +z axis side, and a lower surface 121b, namely the surface on the opposite side from the surface 121a. The surfaces 121a and 121b are parallel to the xy plane, for example.

On the surface 121a of the dielectric layer 121, the metal layer 130 is provided. The metal layer 130 includes wiring electrodes 161 and 162 and pad electrodes 141a (a first pad electrode) and 141b, which are part of the conductor pattern of the metal layer 130.

The wiring electrode 161 electrically connects the pad electrode 141a and the input terminal 31. The wiring electrode 162 electrically connects the pad electrode 141b and the output terminal 32.

The pad electrodes 141a and 141b are provided along the x axis. The pad electrode 141b is positioned on the +x axis side of the pad electrode 141a. The shapes of the pad electrodes 141a and 141b when viewed from the upper side are nearly identical, and are rectangular, for example. Note that the shapes of the pad electrodes 141a and 141b may be different from each other or may be nearly identical but may not be rectangular.

To the pad electrodes 141a and 141b, the first terminal and the second terminal of the inductor component 62 are connected respectively by soldering, for example.

The metal layer 131 is provided such that the dielectric layer 121 (the first dielectric layer) is positioned between the metal layer 131 and the metal layer 130. The metal layer 131 includes an electrode 51 (a first electrode), which is part of the conductor pattern of the metal layer 131. The shape of the electrode 51 when viewed from the upper side is rectangular, for example.

The dielectric layer 122 is provided such that the metal layer 131 is positioned between the dielectric layer 122 and the dielectric layer 121.

The metal layer 132 is provided such that the dielectric layer 122 is positioned between the metal layer 132 and the metal layer 131. The metal layer 132 includes a reference electrode Eg1, which is part of the conductor pattern of the metal layer 132 and to which a reference potential is applied.

The dielectric layer 121 is positioned between the electrode 51 and the pad electrode 141a. When the surface 121a is viewed in a plan view from the upper side, at least part of the electrode 51 overlaps the pad electrode 141a. In the present embodiment, when the surface 121a is viewed in a plan view from the upper side, the entirety of the electrode 51 overlaps the pad electrode 141a. The pad electrode 141a and the electrode 51 form the capacitor 46 (see FIG. 1).

Note that in a case where the dielectric layer 121 is positioned between the pad electrode 141a and at least part of the electrode 51 that overlaps the pad electrode 141a when the surface 121a is viewed in a plan view from the upper side, the pad electrode 141a and the electrode 51 always form the capacitor 46. In other words, the feature that the capacitor 46 is formed by the pad electrode 141a and the electrode 51 is synonymous with the fact that the dielectric layer 121, whose dielectric constant is greater than zero, is positioned between the pad electrode 141a and at least part of the electrode 51 that overlaps the pad electrode 141a when the surface 121a is viewed in a plan view from the upper side.

In the present embodiment, the area of the electrode 51 is smaller than that of the pad electrode 141a. With this configuration, the capacitor 46 having an electrostatic capacitance as small as 0.1 pF can be realized.

The electrode 51 is a connected electrode. In other words, the electrode 51 is an electrode that is connected to another electrode electrically connected to the filter circuit 21. In the present embodiment, the electrode 51 is an electrode that is connected to an electrode having a predetermined electric potential. Specifically, the via 151 is provided under the electrode 51. The via 151 penetrates the dielectric layer 122, and electrically connects the electrode 51 and the reference electrode Eg1. As a result, the electrode 51 is electrically connected to ground.

Effects

Figure 4:
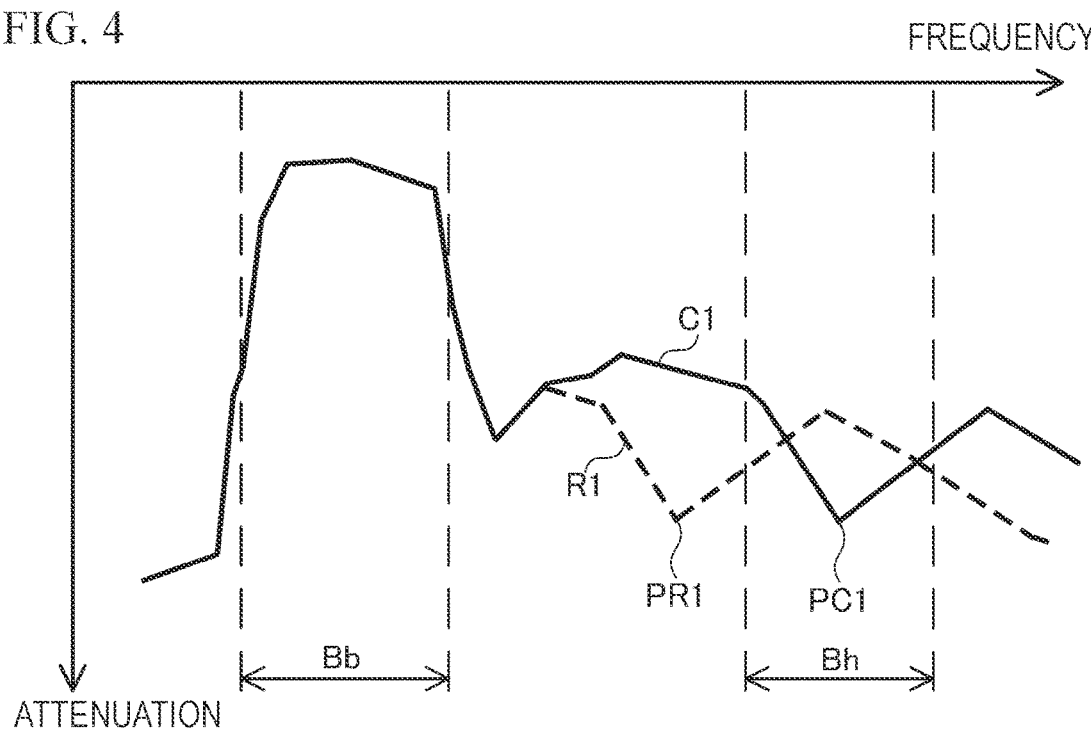
FIG. 4 is a diagram illustrating an example of a filter characteristic of the filter circuit 21 formed in the filter device 11.

FIG. 4 is a diagram illustrating an example of a filter characteristic of the filter circuit 21 formed in the filter device 11. Note that, in FIG. 4, the horizontal axis represents frequency, and the vertical axis represents attenuation.

If, instead of the capacitor 46 formed by the pad electrode 141a and the electrode 51, an SMD having a capacitor function is provided on the surface 121a of the dielectric layer 121, the size of the filter device 11 is increased because a space for two SMDs is required.

Moreover, it is difficult to reduce the electrostatic capacitance of a capacitor in a case where the capacitor is realized using an SMD. In a case where the electrostatic capacitance of a capacitor is high, the filter characteristic is represented by a curve R1 as illustrated in FIG. 4. The curve R1 has a pole PR1 positioned at a lower frequency than a frequency band Bh of harmonics of an RF signal, and thus it is difficult to suppress the passage of harmonics in the frequency band Bh.

In contrast, the configuration in which the capacitor 46 is formed by the pad electrode 141a and the electrode 51 allows the number of SMDs to be provided on the surface 121a of the dielectric layer 121 to be one, which is the inductor component 62, in the filter device 11 according to the present embodiment, and thus an increase in the size of the filter device 11 can be suppressed.

Moreover, the configuration in which the area of the electrode 51 is smaller than that of the pad electrode 141a allows the electrostatic capacitance of the capacitor 46 to be reduced. In a case where the electrostatic capacitance of the capacitor is small, the filter characteristic is represented by a curve C1 as illustrated in FIG. 4. The frequency of a pole PC1 is shifted to a higher frequency band than the pole PR1, and the frequency band of the pole PC1 can be included in the frequency band Bh.

As a result, the passage of harmonics of the RF signal can be effectively suppressed, and the passage of the RF signal can be achieved in a frequency band Bb of the fundamental wave of the RF signal.

Furthermore, by using the configuration in which the entirety of the electrode 51 overlaps the pad electrode 141*a* when the surface 121*a* is viewed in a plan view, it becomes easier to suppress the occurrence of a portion of the electrode 51 that overlaps the inductor component 62 but does not overlap the pad electrode 141 as disclosed below in FIG. 6. This can make it easier to suppress the electromagnetic coupling between the inductor component 62 and the electrode 51, which thus can make it easier to suppress the degradation of the filter characteristic.

Moreover, by using the configuration in which the electrode 51 is connected to the reference electrode Eg1, which is provided on a different layer from the electrode 51, with the via 151 interposed therebetween, the ground of the electrode 51 may not be provided on the same layer as the electrode 51. That is, the area of the electrode 51 can be made that much smaller, and thus the electrostatic capacitance of the capacitor 46 can be further reduced. This allows the frequency of the pole PC1 to be shifted further to a higher frequency band.

Note that the position of the electrode 51 in the plane parallel to the xy plane can be any position as long as the electrode 51 does not protrude from the pad electrode 141*a* when the surface 121*a* is viewed in a plan view.

Specifically, when the surface 121*a* is viewed in a plan view, the electrode 51 may be provided such that the +x axis side edge of the electrode 51 overlaps the +x axis side edge of the pad electrode 141*a* or such that the −x axis side edge of the electrode 51 overlaps the −x axis side edge of the pad electrode 141*a*. The same applies to the y axis direction. This can increase the degree of freedom of the layout of the electrode 51.

Second Embodiment

A filter device 12 according to a second embodiment will be described. In the second and subsequent embodiments, description of matters in common with the first embodiment is omitted, and only the differences will be described. In particular, similar effects of similar configurations are not individually mentioned for each embodiment.

Figure 5:
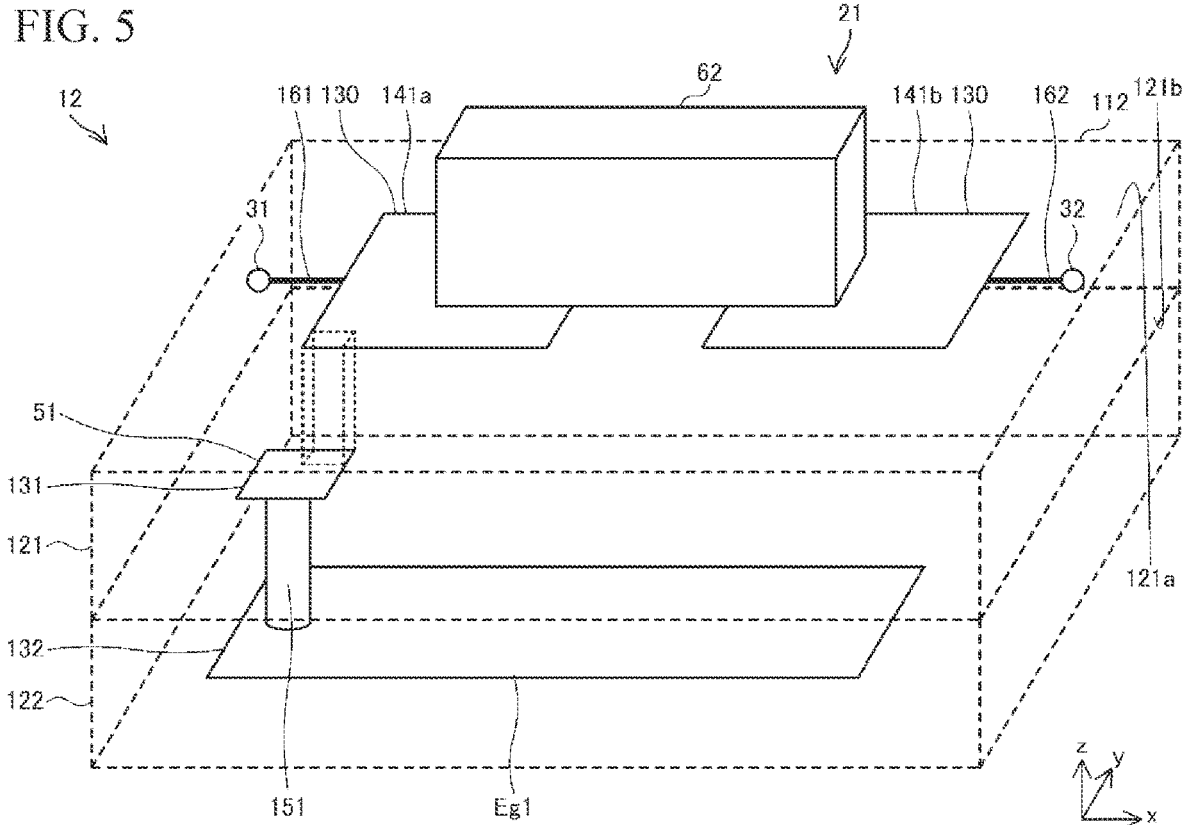
FIG. 5 is a perspective view schematically illustrating a filter device 12.

FIG. 5 is a perspective view schematically illustrating the filter device 12. As illustrated in FIG. 5, the filter device 12 according to the second embodiment differs from the filter device 11 according to the first embodiment in that not the entirety but part of the electrode 51 overlaps the pad electrode 141*a* when the surface 121*a* of the dielectric layer 121 is viewed in a plan view.

Compared with the filter device 11 illustrated in FIG. 2, the filter device 12 includes a multilayer substrate 112 instead of the multilayer substrate 111.

In the multilayer substrate 112 of the filter device 12, when the surface 121*a* of the dielectric layer 121 is viewed in a plan view, part of the electrode 51 positioned on the +x axis side and the +y axis side of the electrode 51 overlaps part of the pad electrode 141*a* positioned on the −x axis side and the −y axis side of the pad electrode 141*a*.

With this configuration, the electrostatic capacitance of the capacitor 46 formed by the pad electrode 141*a* and the electrode 51 can be made extremely small. This allows the pole PC1 of the curve C1 (see FIG. 4) to be shifted to a further higher frequency band.

Figure 6:
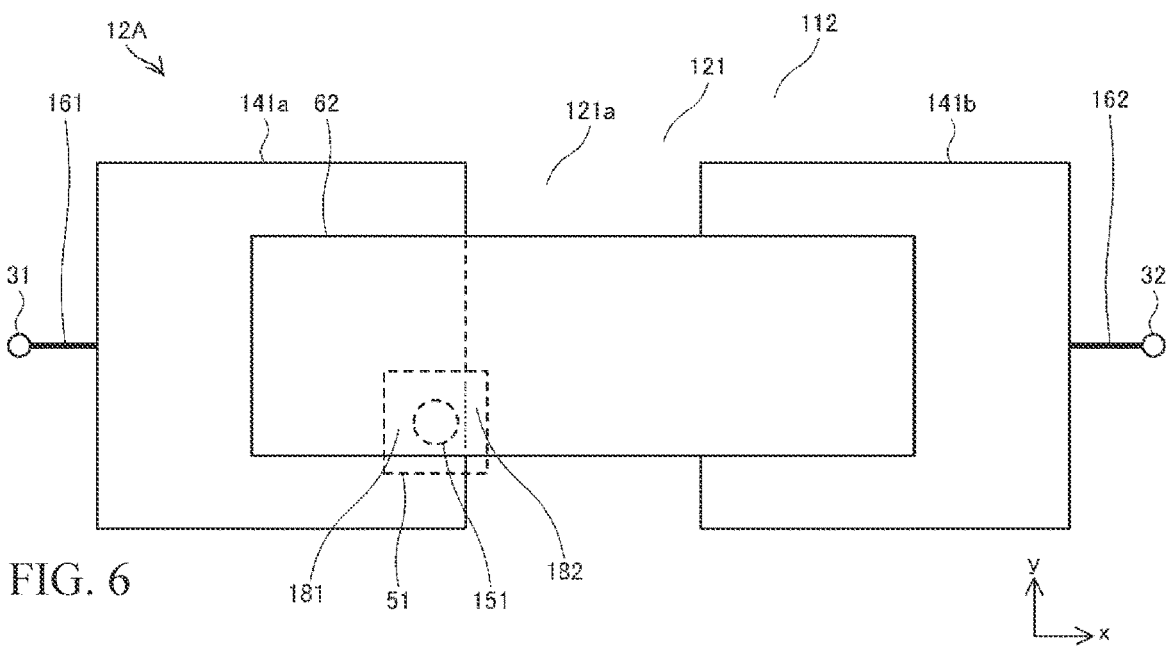
FIG. 6 is a plan view schematically illustrating a filter device 12A, which is a first modification of the filter device 12, the plan view being a view seen from the upper side.

FIG. 6 is a plan view schematically illustrating a filter device 12A, which is a first modification of the filter device 12, the plan view being a view seen from the upper side. As in the filter device 12A illustrated in FIG. 6, when the surface 121*a* of the dielectric layer 121 is viewed in a plan view, an overlapping portion 181, which is part of the electrode 51, may be configured to overlap the inductor component 62.

However, when the surface 121*a* of the dielectric layer 121 is viewed in a plan view, in a case where a portion 182 is present, which is included in the electrode 51 and overlaps not the pad electrode 141*a* but the inductor component 62, the portion 182 and the inductor component 62 are electromagnetically coupled and the filter characteristic may deteriorate.

Figure 7:
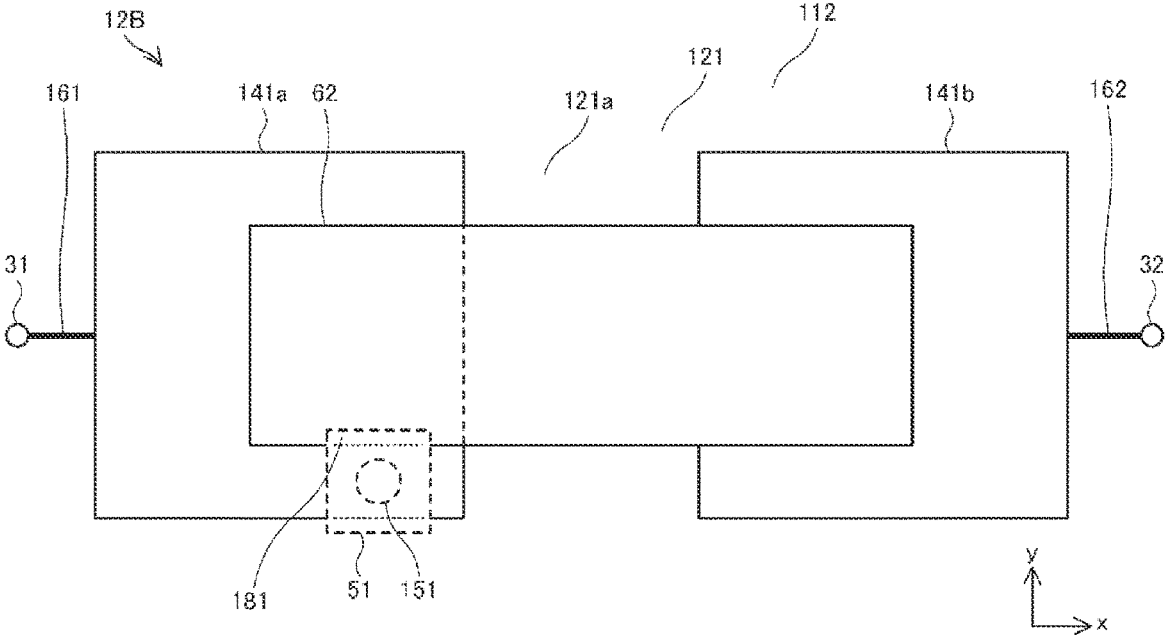
FIG. 7 is a plan view schematically illustrating a filter device 12B, which is a second modification of the filter device 12, the plan view being a view seen from the upper side.

FIG. 7 is a plan view schematically illustrating a filter device 12B, which is a second modification of the filter device 12, the plan view being a view seen from the upper side. As illustrated in FIG. 7, when the surface 121*a* of the dielectric layer 121 is viewed in a plan view, in a case where an overlapping portion 181 is present where the inductor component 62 and the electrode 51 overlap each other, the overlapping portion 181 overlaps the pad electrode 141*a* in the filter device 12B.

This configuration can suppress the electromagnetic coupling between the inductor component 62 and the electrode 51, and thus the degradation of the filter characteristic can be suppressed.

Third Embodiment

Figure 8:
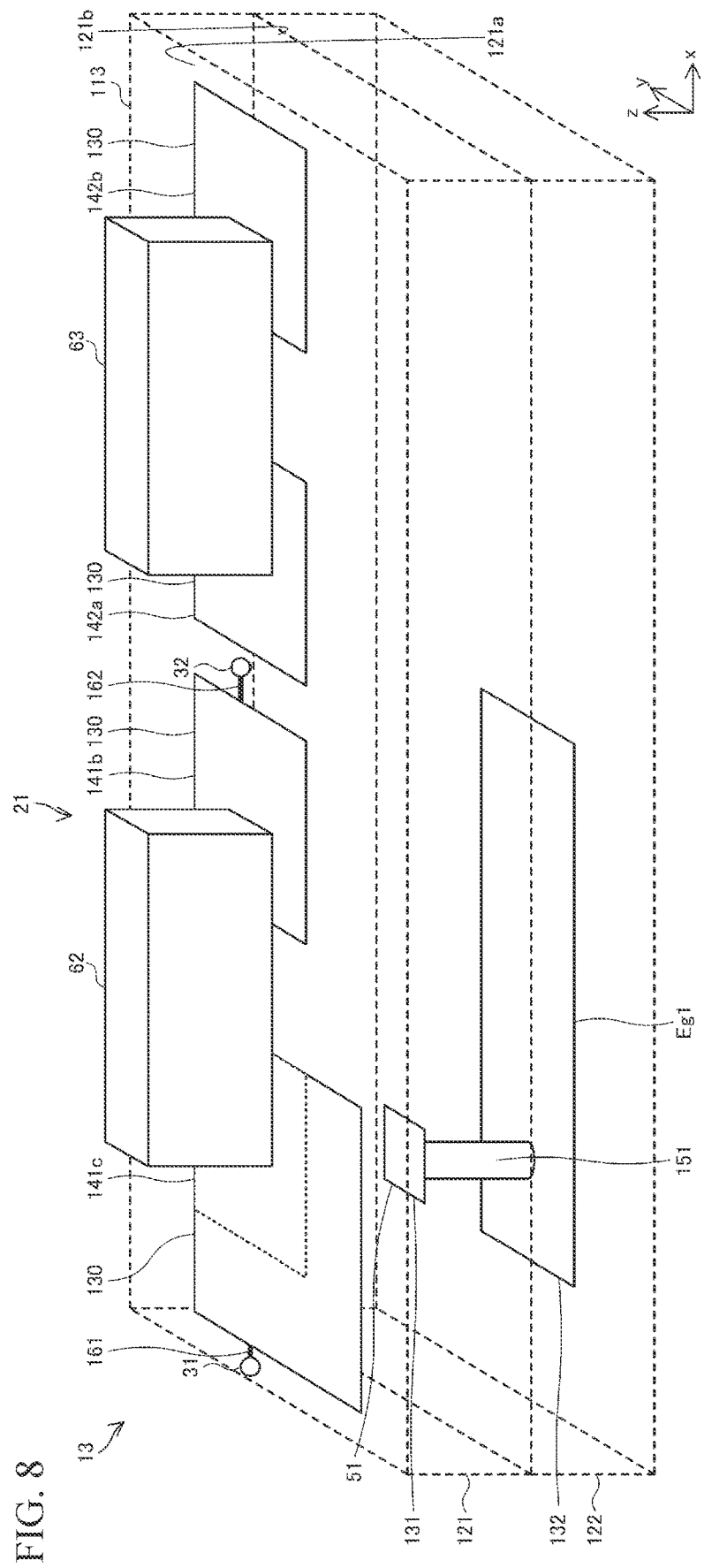
FIG. 8 is a perspective view schematically illustrating a filter device 13.

A filter device 13 according to a third embodiment will be described. FIG. 8 is a perspective view schematically illustrating the filter device 13. As illustrated in FIG. 8, the filter device 13 according to the third embodiment differs from the filter device 11 according to the first embodiment in that the area of a pad electrode with which the capacitor 46 is formed is large.

Compared with the filter device 11 illustrated in FIG. 2, the filter device 13 includes a multilayer substrate 113 instead of the multilayer substrate 111 and further includes an inductor component 63.

Compared with the multilayer substrate 111 illustrated in FIG. 2, the multilayer substrate 113 includes a pad electrode 141*c* instead of the pad electrode 141*a* and further includes pad electrodes 142*a* and 142*b*.

The inductor component 63 is substantially the same SMD as the inductor component 62 and has the function of a capacitor, an inductor, or a resistor.

The pad electrodes 142*a* and 142*b* are part of the conductor pattern of the metal layer 130. To the pad electrodes 142*a* and 142*b*, the first terminal and the second terminal of the inductor component 63 are connected respectively by soldering, for example.

The pad electrodes 141*b*, 142*a*, and 142*b* are electrodes for soldering one SMD terminal, and thus have approximately the same area.

The area of the pad electrode 141*c* is larger than each of the areas of the pad electrodes 141*b*, 142*a*, and 142*b*. Note that, in FIG. 8, the area of the region indicated by the dotted line in the pad electrode 141*c* is approximately the same as each of the areas of the pad electrodes 141*b*, 142*a*, and 142*b*. Note that the area of the pad electrode 141*c* may be the same as each of the areas of the pad electrodes 141*b*, 142*a*, and 142*b*. That is, it is sufficient that the area of the pad electrode 141*c* be greater than or equal to the area indicated by the dotted line.

In this manner, the configuration in which the pad electrode 141*c* has a large area can increase the degree of freedom of the position of the electrode 51 in the plane parallel to the xy plane, thus increasing the degree of freedom of the layout of the electrode 51.

Moreover, the area of the electrode 51 can be increased, and thus the electrostatic capacitance of the capacitor 46 formed by the pad electrode 141*c* and the electrode 51 can be increased. This allows the pole PC1 of the curve C1 (see FIG. 4) to be shifted to a lower frequency band.

Fourth Embodiment

Figure 9:
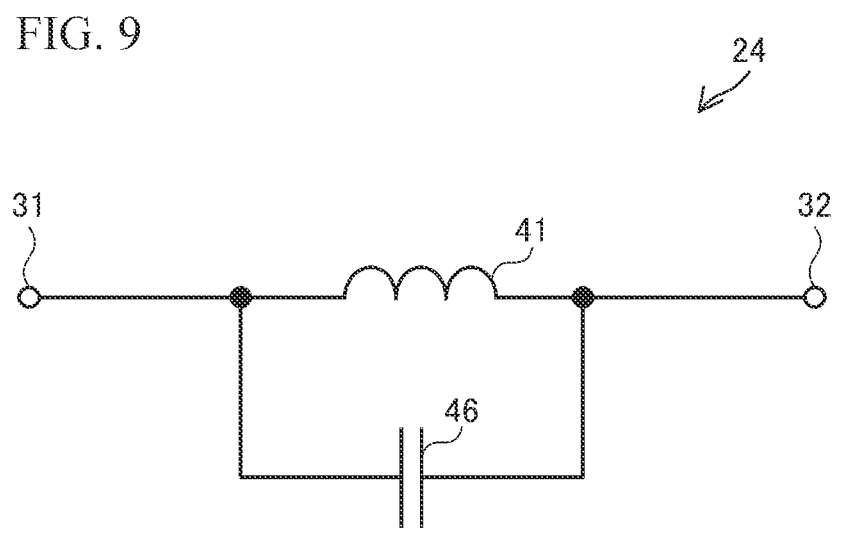

A filter circuit 24 and a filter device 14 according to a fourth embodiment will be described. FIG. 9 is a circuit diagram of the filter circuit 24. As illustrated in FIG. 9, the filter circuit 24 according to the fourth embodiment differs from the filter circuit 21 according to the first embodiment in that the filter circuit 24 is a tank circuit.

As illustrated in FIG. 9, compared with the filter circuit 21 illustrated in FIG. 1, the second end of the capacitor 46 is connected to not ground but the output terminal 32 in the filter circuit 24. The filter circuit 24 is a parallel resonant circuit.

Figure 10:
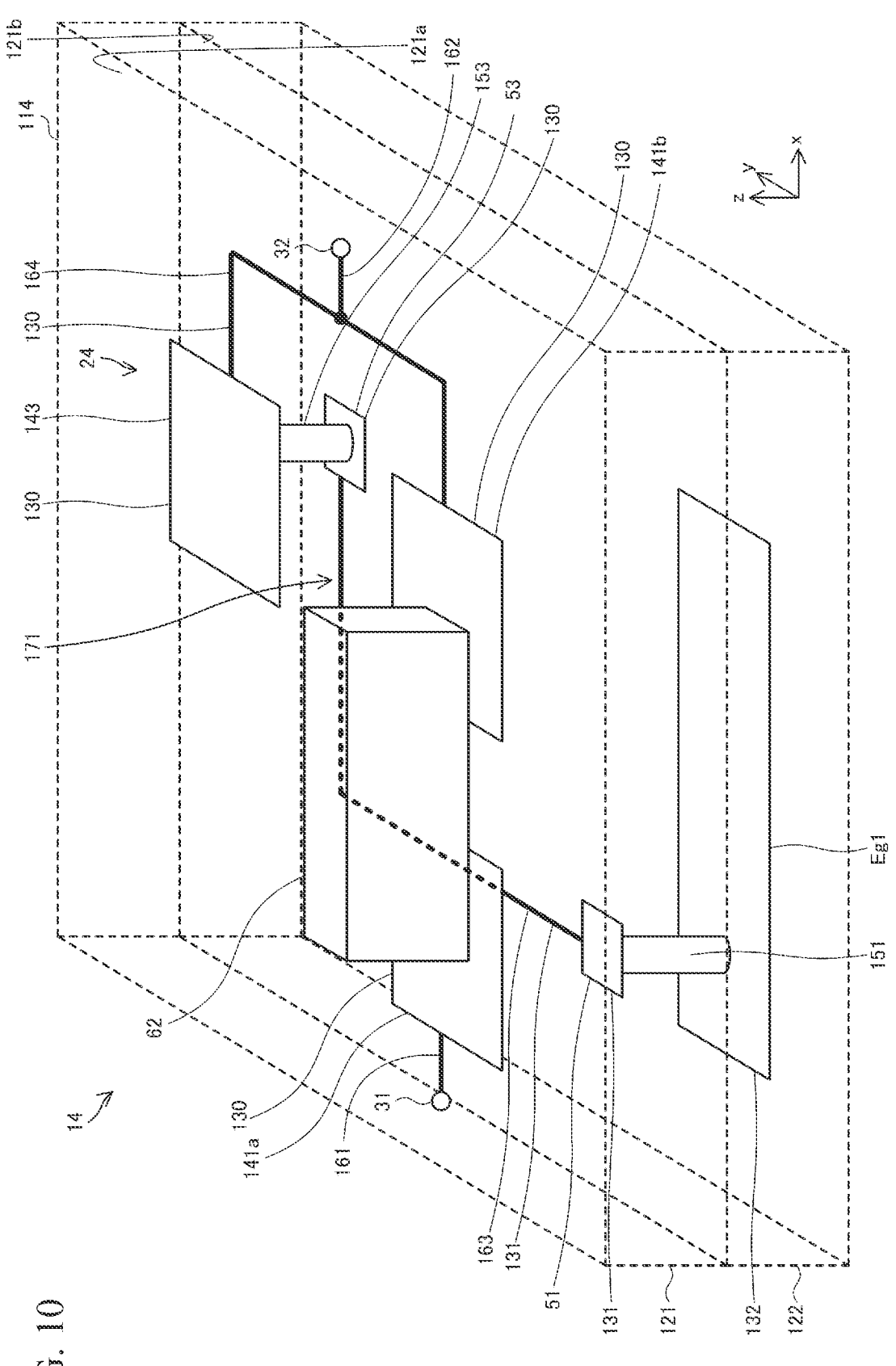
FIG. 10 is a perspective view schematically illustrating a filter device 14.

FIG. 10 is a perspective view schematically illustrating the filter device 14. As illustrated in FIG. 10, compared with the filter device 11 illustrated in FIG. 2, the filter device 14 includes a multilayer substrate 114 instead of the multilayer substrate 111. In the filter device 14, the filter circuit 24 is formed.

Compared with the multilayer substrate 111 illustrated in FIG. 2, the multilayer substrate 114 further includes a wiring line 171. The wiring line 171 includes electrodes 53 and 143, a via 153, and wiring electrodes 163 and 164.

In the multilayer substrate 114, the metal layer 130 includes the pad electrodes 141*a* (the first pad electrode) and 141*b* (a second pad electrode), the electrode 143, and the wiring electrodes 161, 162 and 164, which are part of the conductor pattern of the metal layer 130.

The metal layer 131 includes the electrodes 51 and 53 and the wiring electrode 163, which are part of the conductor pattern of the metal layer 131. The dielectric layer 121 includes the via 153.

The wiring line 171 electrically connects the electrode 51 and the pad electrode 141*b*. In detail, the wiring electrode 163 included in the wiring line 171 electrically connects the electrode 51 and the electrode 53 in the metal layer 131.

When the surface 121*a* of the dielectric layer 121 is viewed in a plan view, the wiring electrode 163 and the inductor component 62 do not overlap each other. This can make it possible to suppress the electromagnetic coupling between the wiring electrode 163 and the inductor component 62, which thus can make it possible to suppress the degradation of the filter characteristic.

The via 153 electrically connects the electrode 53 and the electrode 143. The wiring electrode 164 electrically connects the electrode 143 to the pad electrode 141*b* and the wiring electrode 162 in the metal layer 130.

The capacitor 46, which is formed by the pad electrode 141*a* and the electrode 51, and the inductor component 62 form a parallel resonant circuit.

Fifth Embodiment

Figure 11:
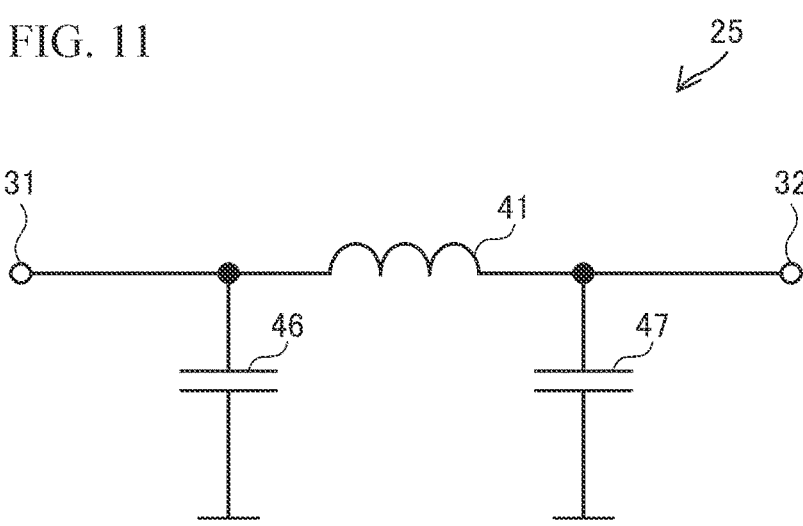
FIG. 11 is a circuit diagram of a filter circuit 25.

A filter circuit 25 and a filter device 15 according to a fifth embodiment will be described. FIG. 11 is a circuit diagram of the filter circuit 25. As illustrated in FIG. 11, the filter circuit 25 according to the fifth embodiment differs from the filter circuit 21 according to the first embodiment in that the filter circuit 25 is a π type filter circuit.

As illustrated in FIG. 11, compared with the filter circuit 21 illustrated in FIG. 1, the filter circuit 25 further includes a capacitor 47. The capacitor 47 has a first end connected to the output terminal 32, and a second end connected to ground.

Figure 12:
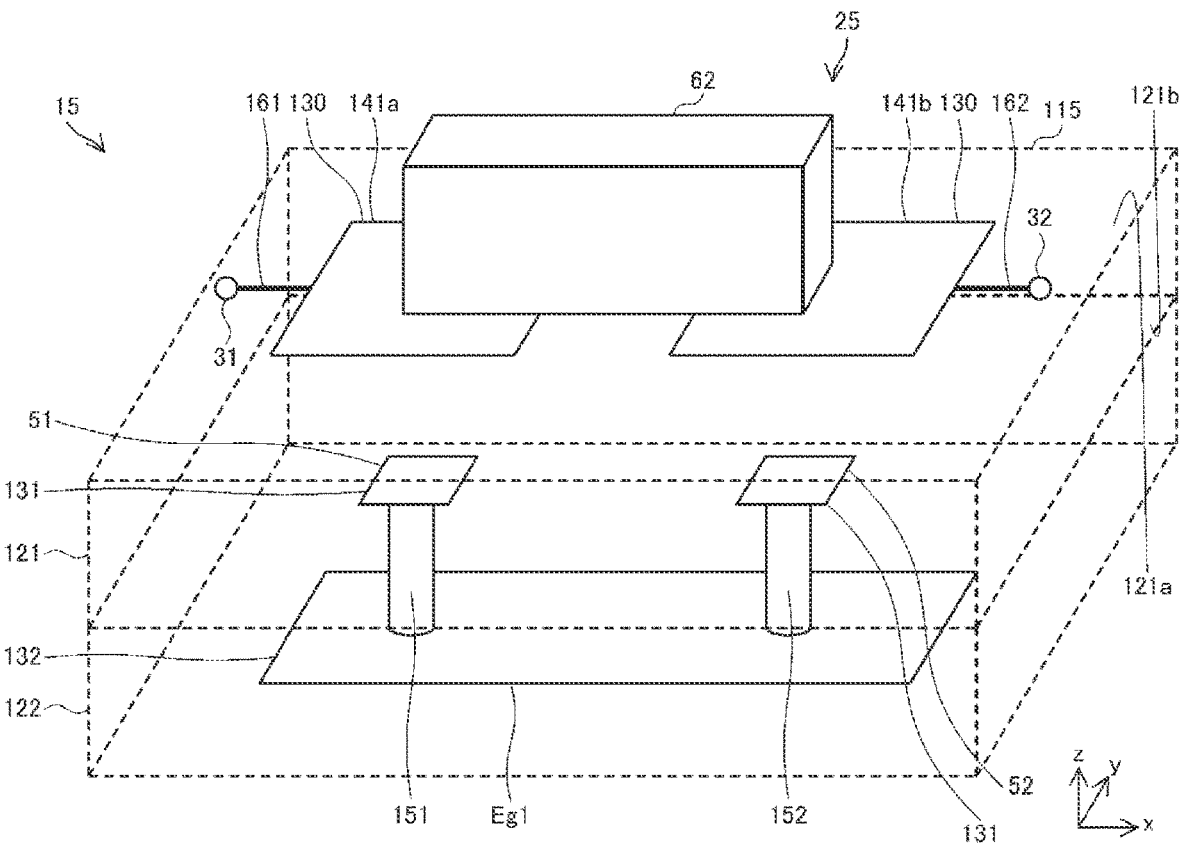
FIG. 12 is a perspective view schematically illustrating a filter device 15.

FIG. 12 is a perspective view schematically illustrating the filter device 15. As illustrated in FIG. 12, compared with the filter device 11 illustrated in FIG. 2, the filter device 15 includes a multilayer substrate 115 instead of the multilayer substrate 111. In the filter device 15, the filter circuit 25 is formed.

Compared with the multilayer substrate 111 illustrated in FIG. 2, the multilayer substrate 115 further includes an electrode 52 (a second electrode) and a via 152.

In the multilayer substrate 115, the metal layer 131 includes the electrodes 51 and 52, which are part of the conductor pattern of the metal layer 131. The dielectric layer 122 includes the vias 151 and 152. The shape of the electrode 52 when viewed from the upper side is rectangular, for example.

The dielectric layer 121 is positioned between the electrode 52 and the pad electrode 141*b*. When the surface 121*a* of the dielectric layer 121 is viewed in a plan view from the upper side, at least part of the electrode 52 overlaps the pad electrode 141*b*. In the present embodiment, when the surface 121*a* is viewed in a plan view from the upper side, the entirety of the electrode 52 overlaps the pad electrode 141*b*. Note that when the surface 121*a* is viewed in a plan view from the upper side, part of the electrode 52 may be configured to overlap the pad electrode 141*b*. The pad electrode 141*b* and the electrode 52 form the capacitor 47.

In the present embodiment, the area of the electrode 52 is smaller than that of the pad electrode 141*b*. With this configuration, the capacitor 47 having an electrostatic capacitance as small as 0.1 pF can be realized.

The electrode 52 is a connected electrode. In the present embodiment, the via 152 is provided under the electrode 52. The via 152 penetrates the dielectric layer 122, and electrically connects the electrode 52 and the reference electrode Eg1. As a result, the electrode 52 is electrically connected to ground.

Sixth Embodiment

Figure 13:
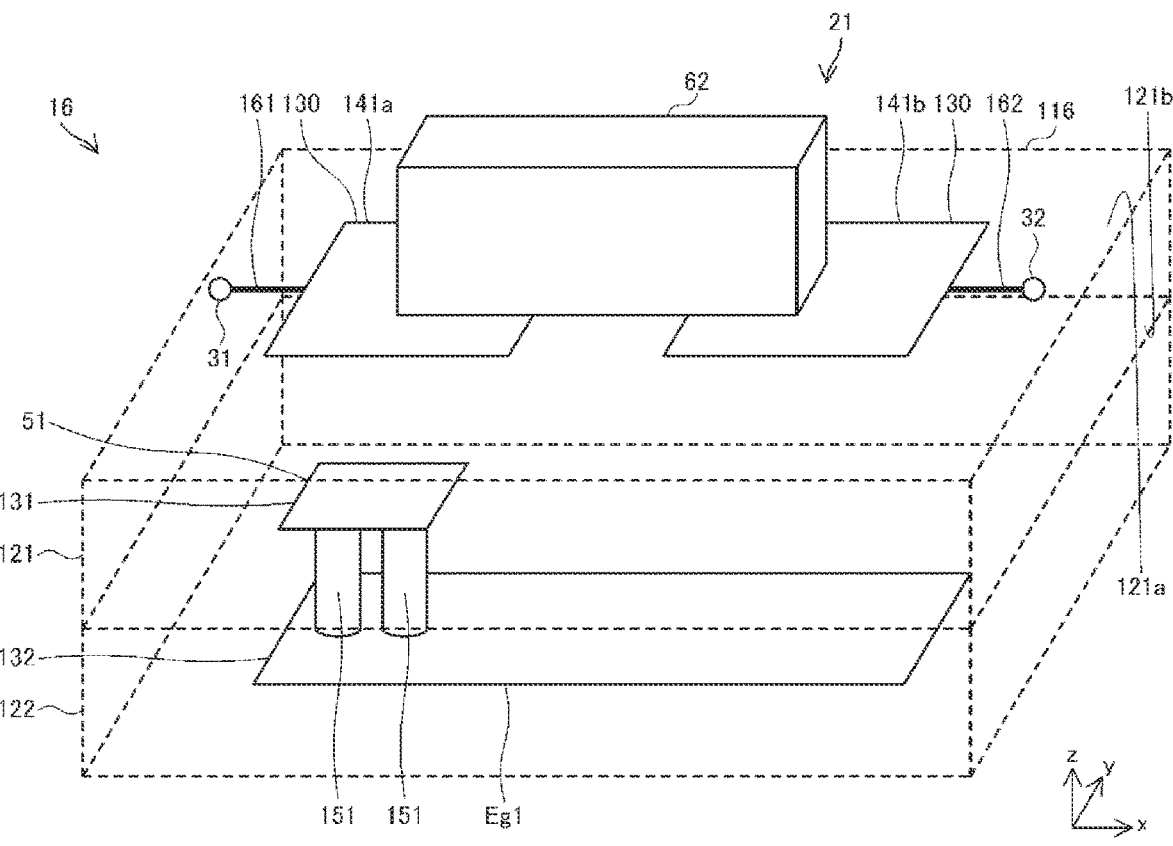
FIG. 13 is a perspective view schematically illustrating a filter device 16.

A filter device 16 according to a sixth embodiment will be described. FIG. 13 is a perspective view schematically illustrating the filter device 16. As illustrated in FIG. 13, the filter device 16 according to the sixth embodiment differs from the filter device 11 according to the first embodiment in that a plurality of vias 151 are provided to electrically connect the electrode 51 and the reference electrode Eg1.

Compared with the filter device 11 illustrated in FIG. 2, the filter device 16 includes a multilayer substrate 116 instead of the multilayer substrate 111.

Compared with the multilayer substrate 111 illustrated in FIG. 2, the multilayer substrate 116 includes two vias 151. In the dielectric layer 122, the two vias 151 electrically connect the electrode 51 and the reference electrode Eg1.

This configuration can suppress the fluctuation of the potential of the electrode 51 with respect to the potential of the reference electrode Eg1, and thus the attenuation at the pole PC1 of the curve C1 (see FIG. 4) can be increased. As a result, the passage of harmonics of the RF signal can be more effectively suppressed.

Note that, in the present embodiment, the configuration has been described in which the two vias 151 are provided in the dielectric layer 122 to electrically connect the electrode 51 and the reference electrode Eg1; however, the configuration is not limited to this. In the dielectric layer 122, a configuration may be used in which three or more vias 151 are provided to electrically connect the electrode 51 and the reference electrode Eg1.

Seventh Embodiment

Figure 14:
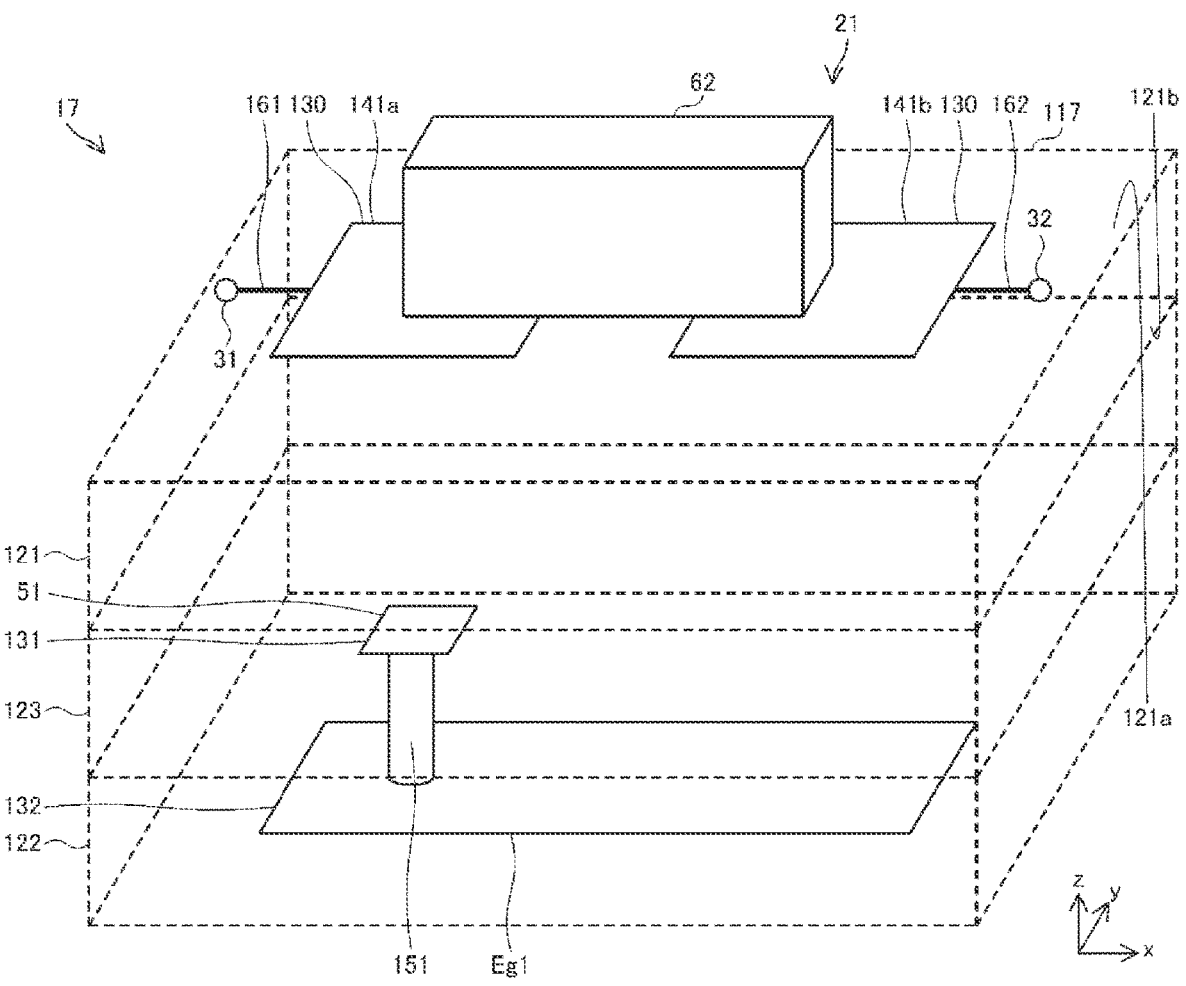
FIG. 14 is a perspective view schematically illustrating a filter device 17.

A filter device 17 according to a seventh embodiment will be described. FIG. 14 is a perspective view schematically illustrating the filter device 17. As illustrated in FIG. 14, the filter device 17 according to the seventh embodiment differs from the filter device 11 according to the first embodiment in that a dielectric layer 123 is provided between the metal layer 131 and the dielectric layer 121.

Compared with the filter device 11 illustrated in FIG. 2, the filter device 17 includes a multilayer substrate 117 instead of the multilayer substrate 111.

Compared with the multilayer substrate 111 illustrated in FIG. 2, the multilayer substrate 117 further includes the dielectric layer 123 (a third dielectric layer).

The configuration in which the dielectric layer 123 is positioned between the dielectric layer 121 and the metal layer 131 can increase the distance between the electrode 51 and the pad electrode 141a. Thus, the electrostatic capacitance of the capacitor 46 formed by the pad electrode 141a and the electrode 51 can be reduced. This allows the pole PC1 of the curve C1 (see FIG. 4) to be shifted to a further higher frequency band.

Note that, although not illustrated in FIG. 14, a configuration may be used in which another metal layer is provided between the dielectric layer 121 and the dielectric layer 123. When the surface 121a of the dielectric layer 121 is viewed in a plan view, the conductor pattern included in the other metal layer does not overlap the region where the pad electrode 141a and the electrode 51 overlap each other.

Eighth Embodiment

Figure 15:
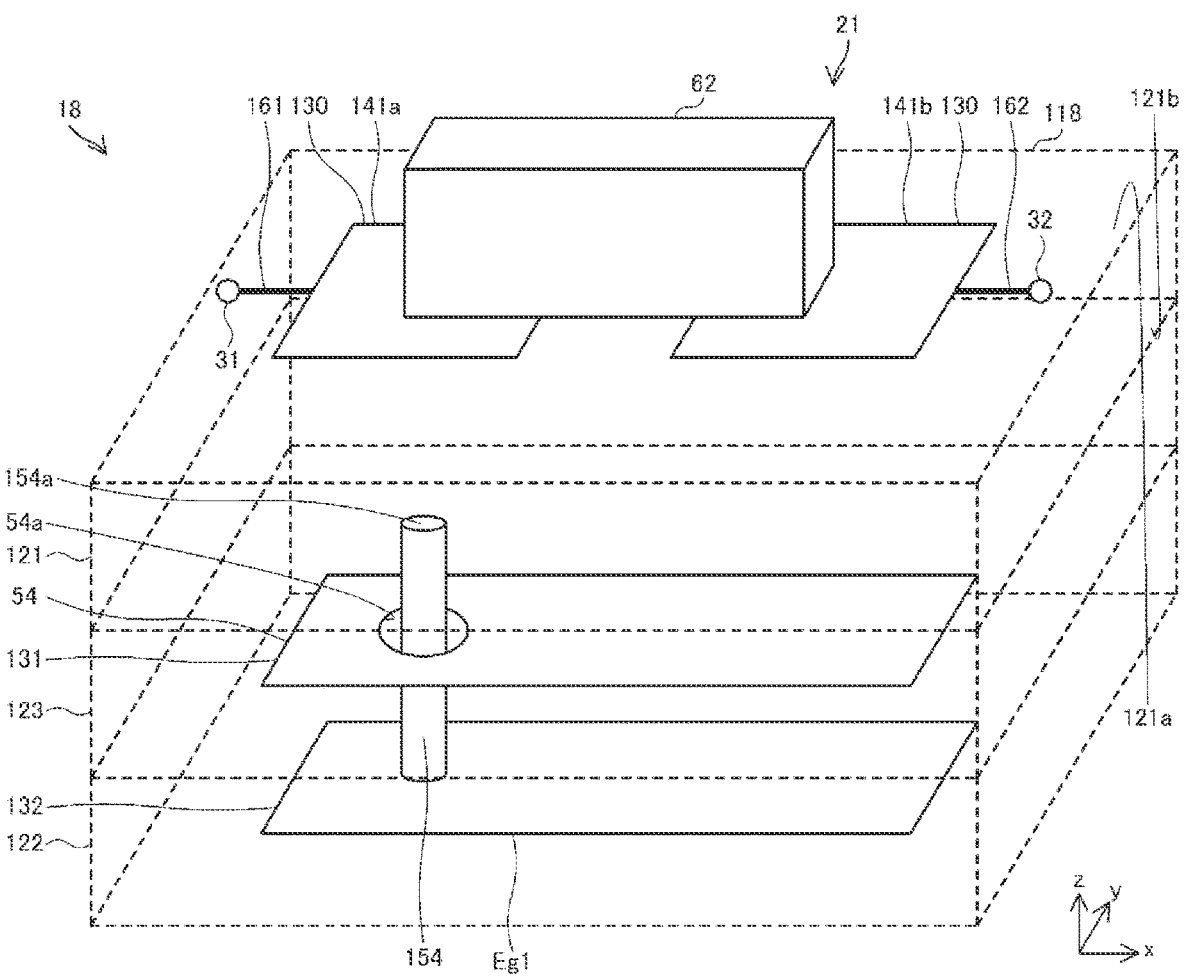
FIG. 15 is a perspective view schematically illustrating a filter device 18.

A filter device 18 according to an eighth embodiment will be described. FIG. 15 is a perspective view schematically illustrating the filter device 18. As illustrated in FIG. 15, the filter device 18 according to the eighth embodiment differs from the filter device 17 according to the seventh embodiment in that the electrode corresponding to the second end of the capacitor 46 is a via, not a conductor pattern.

Compared with the filter device 17 illustrated in FIG. 14, the filter device 18 includes a multilayer substrate 118 instead of the multilayer substrate 117.

Compared with the multilayer substrate 117 illustrated in FIG. 14, the multilayer substrate 118 includes an electrode 54 and a via 154 (a second via) instead of the electrode 51 and the via 151, respectively.

The metal layer 131 includes the electrode 54, which is a conductor pattern. In the electrode 54, a through hole 54a is formed.

In the present embodiment, the via 154 is a first electrode. The via 154 penetrates the dielectric layers 122 (the second dielectric layer) and 123 through the inside of the through hole 54a. The cross-sectional shape of the via 154 is circular or elliptical. Note that the cross-sectional shape of the via 154 may be any other shape.

In the present embodiment, when the surface 121a of the dielectric layer 121 is viewed in a plan view from the upper side, the entirety of a surface 154a of the via 154 overlaps the pad electrode 141a. Note that when the surface 121a of the dielectric layer 121 is viewed in a plan view from the upper side, part of the surface 154a of the via 154 may be configured to overlap the pad electrode 141a. The pad electrode 141a and the via 154 form the capacitor 46 (see FIG. 1).

The bottom surface of the via 154 is in contact with the reference electrode Eg1 in the metal layer 132. The top surface 154a of the via 154 is roughly parallel to the xy plane and faces the pad electrode 141a with the dielectric layer 121 interposed therebetween.

In this manner, the configuration in which the via 154 having a very small cross-sectional area is the first electrode allows the electrostatic capacitance of the capacitor 46 formed by the pad electrode 141a and the via 154 to be extremely small. This allows the pole PC1 of the curve C1 (see FIG. 4) to be shifted to a further higher frequency band.

Ninth Embodiment

Figure 16:
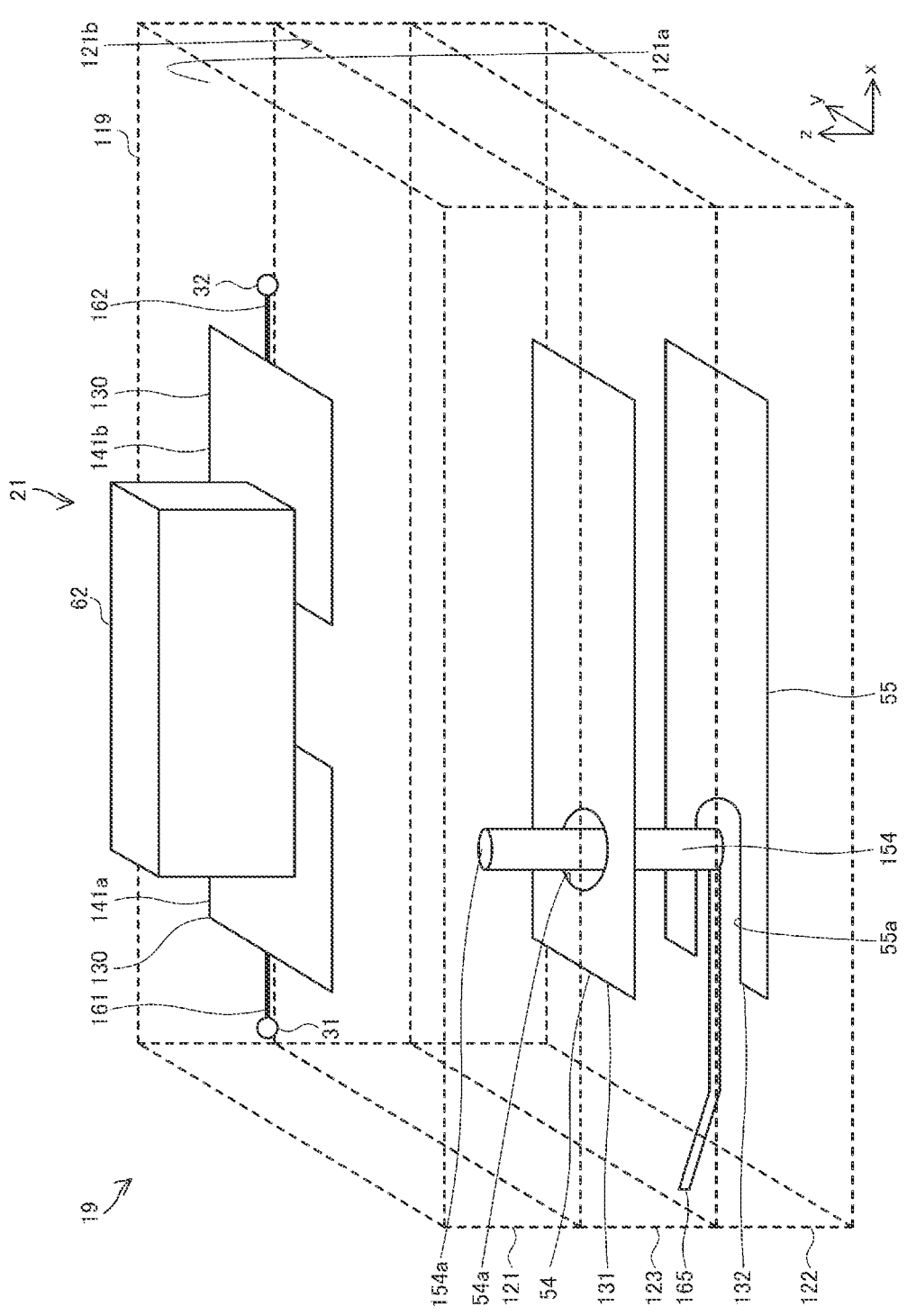
FIG. 16 is a perspective view schematically illustrating a filter device 19.

A filter device 19 according to a ninth embodiment will be described. FIG. 16 is a perspective view schematically illustrating the filter device 19. As illustrated in FIG. 16, the filter device 19 according to the ninth embodiment differs from the filter device 18 according to the eighth embodiment in that the bottom side of the via 154 is connected to ground through a wiring electrode.

Compared with the filter device 18 illustrated in FIG. 15, the filter device 19 includes a multilayer substrate 119 instead of the multilayer substrate 118.

Compared with the multilayer substrate 118 illustrated in FIG. 15, the multilayer substrate 119 includes an electrode 55 instead of the reference electrode Eg1.

The metal layer 132 includes the electrode 55 and a wiring electrode 165, each of which is a conductor pattern. On the −x axis side of the electrode 55, a notch 55a is formed which is notched toward the +x axis side.

The bottom side of the via 154 is positioned inside the notch 55a of the electrode 55 in the metal layer 132 and is not in contact with the electrode 55. The bottom side of the via 154 is electrically connected to ground (not illustrated) through the wiring electrode 165.

Note that the configuration of the filter device 15 has been described in which the electrodes 51 and 52 are provided; however, the configuration is not limited to this. A configuration may be used in which the electrodes 51 and 52 are provided. In this case, the vias 151 and 152 become the first electrode and the second electrode, respectively.

The above description illustrates exemplary embodiments of the present disclosure. Each of the filter devices 11 to 19 includes the inductor component 62 and a corresponding one of the multilayer substrates 111 to 119. On the multilayer substrates 111 to 119, the inductor component 62 is mounted. The multilayer substrates 111 to 119 include the dielectric layer 121, the pad electrode 141a, and the electrode 51 or the via 154. The dielectric layer 121 has the surface 121a. The pad electrode 141a is provided on the surface 121a (a mounting surface 121a), and the first terminal of the inductor component 62 is connected to the pad electrode 141a. The electrode 51 or the via 154 is a connected electrode, and the dielectric layer 121 is provided so as to be positioned between the electrode 51 or the via 154 and the pad electrode 141a. When the surface 121a is viewed in a plan view, at least part of the electrode 51 or the via 154 overlaps the pad electrode 141a. The pad electrode 141a and the at least part of the electrode 51 or the via 154 form the capacitor 46.

In this manner, the configuration in which the capacitor 46 is formed by the pad electrode 141a and the at least part of the electrode 51 or the via 154 can realize the filter devices 11 to 19 in which the filter circuit 21, 24 or 25 is formed without providing an SMD functioning as the capacitor 46 on the surface 121a in addition to the inductor component 62. As a result, the sizes of the filter devices 11 to 19 can be reduced.

In the filter devices 11 to 19, when the surface 121a (the mounting surface 121a) is viewed in a plan view, the area of the electrode 51 or the via 154 is smaller than that of the pad electrode 141a.

In this manner, the configuration in which the area of the electrode 51 or the via 154 is smaller than that of the pad electrode 141a allows the electrostatic capacitance of the capacitor 46 to be reduced. In the filter characteristic where the electrostatic capacitance of the capacitor 46 is small, the frequency of the pole PC1 can be shifted to a higher frequency band, and the frequency of the pole PC1 can be included in the frequency band Bh of harmonics of the RF signal. As a result, the passage of harmonics of the RF signal can be effectively suppressed, and the passage of the RF signal can be achieved in the frequency band Bb of the fundamental wave of the RF signal.

Moreover, in the filter devices 11 and 13 to 19, when the surface 121a (the mounting surface 121a) is viewed in a plan view, the entirety of the electrode 51 overlaps the pad electrode 141a.

In this manner, when the surface 121a is viewed in a plan view, the entirety of the electrode 51 is configured to overlap the pad electrode 141a. Thus, it becomes easier to suppress the occurrence of a portion of the electrode 51 that overlaps the inductor component 62 but does not overlap the pad electrode 141. This can make it easier to suppress the electromagnetic coupling between the inductor component 62 and the electrode 51, which thus can make it easier to suppress the degradation of the filter characteristic.

Moreover, the multilayer substrates 111 to 117 further include the metal layer 131, the dielectric layer 122, the metal layer 132, and the via (s) 151. The metal layer 131 includes the electrode 51, and the dielectric layer 121 is provided so as to be positioned between the metal layer 131 and the pad electrode 141a. The dielectric layer 122 is provided such that the metal layer 131 is positioned between the dielectric layer 122 and the dielectric layer 121. The metal layer 132 includes the reference electrode Eg1, to which a reference potential is applied, and is provided such that the dielectric layer 122 is positioned between the metal layer 132 and the metal layer 131. The via 151 or vias 151 penetrate the dielectric layer 122, and electrically connect the electrode 51 and the reference electrode Eg1.

In this manner, the configuration in which the electrode 51 is electrically connected to the reference electrode Eg1 through the via (s) 151 allows the capacitor 46 to have not a stray capacitance but a capacitance connected to the reference potential. This allows the harmonics of the RF signal to reach the reference electrode Eg1 through the capacitor 46. Moreover, if the electrode 51 is electrically connected to the reference electrode Eg1 through the conductor pattern of the metal layer 131, there may be a case where the conductor pattern and the pad electrode 141a form a capacitor so that the pole PC1 is shifted to a lower frequency band. In contrast, the above-described configuration allows the electrode 51 to be electrically connected to the reference electrode Eg1 without forming such a capacitor. Thus, it is possible to suppress the shift of the pole PC1 to a lower frequency band.

Moreover, when the surface 121a of the dielectric layer 121 is viewed in a plan view in the filter device 12B, in a case where the overlapping portion 181 is present where the inductor component 62 and the electrode 51 overlap each other, the overlapping portion 181 overlaps the pad electrode 141a.

This configuration can suppress the electromagnetic coupling between the inductor component 62 and the electrode 51, and thus the degradation of the filter characteristic can be suppressed.

Moreover, in the filter device 14, the multilayer substrate 114 further includes the pad electrode 141b and the wiring line 171. The pad electrode 141b is provided on the surface 121a of the dielectric layer 121, and the second terminal of the inductor component 62 is connected to the pad electrode 141b. The wiring line 171 connects the electrode 51 and the pad electrode 141b. The capacitor 46 and the inductor component 62 form a parallel resonant circuit.

This configuration can realize the filter device 14, which is small in size and in which a tank circuit is formed, the tank circuit including the capacitor 46 whose electrostatic capacitance is small.

Moreover, in the filter device 15, the multilayer substrate 115 further includes the pad electrode 141b and the electrode 52. The pad electrode 141b is provided on the surface 121a of the dielectric layer 121, and the second terminal of the inductor component 62 is connected to the pad electrode 141b. The electrode 52 is a connected electrode, and the dielectric layer 121 is provided so as to be positioned between the electrode 52 and the pad electrode 141b. When the surface 121a is viewed in a plan view, at least part of the electrode 52 overlaps the pad electrode 141b. The pad electrode 141b and the at least part of the electrode 52 form the capacitor 47.

This configuration can realize the filter device 15, which is small in size and in which a π type filter circuit is formed, the π type filter circuit including the capacitors 46 and 47 whose electrostatic capacitances are small.

Moreover, in the filter device 16, the multilayer substrate 116 includes the plurality of vias 151.

This configuration can suppress the fluctuation of the potential of the electrode 51 with respect to the potential of the reference electrode Eg1, and thus the attenuation at the pole PC1 (see FIG. 4) can be increased. As a result, the passage of harmonics of the RF signal can be more effectively suppressed.

Moreover, in the filter device 17, the multilayer substrate 117 further includes the dielectric layer 123, which is positioned between the dielectric layer 121 and the electrode 51.

In this manner, the configuration in which the dielectric layer 123 is positioned between the dielectric layer 121 and the electrode 51 can increase the distance between the electrode 51 and the pad electrode 141a. Thus, the electrostatic capacitance of the capacitor 46 formed by the pad electrode 141a and the electrode 51 can be reduced. This allows the pole PC1 (see FIG. 4) to be shifted to a further higher frequency band.

Moreover, in the filter device 18 or 19, the multilayer substrate 118 or 119 further includes the electrode 54 and the via 154. The dielectric layer 122 is provided such that the dielectric layer 121 is positioned between the dielectric layer 122 and the pad electrode 141a. The via 154 penetrates the dielectric layer 122 and is the first electrode.

In this manner, the configuration in which the via 154 having a very small cross-sectional area is the first electrode allows the electrostatic capacitance of the capacitor 46 formed by the pad electrode 141*a* and the via 154 to be extremely small. This allows the pole PC1 (see FIG. 4) to be shifted to a further higher frequency band.

Note that each of the embodiments described above is intended to facilitate understanding of the present disclosure and is not intended to interpret the present disclosure in a limited manner. The present disclosure may be changed or improved without departing from its gist, and the present disclosure includes its equivalents. That is, each embodiment with appropriate design changes made by those skilled in the art is also included in the scope of the present disclosure as long as it has the features of the present disclosure. For example, each element of each embodiment and the arrangement, material, condition, shape, and size of the element, for example, are not limited to those illustrated in the examples, but can be changed as needed. In addition, each embodiment is an example, and it is needless to say that partial substitutions or combinations of the configurations illustrated in the different embodiments are possible, and these are also included in the scope of the present disclosure as long as they include the features of the present disclosure.

A filter device including: an inductor component, and a substrate on which the inductor component is mounted, the substrate including a first dielectric layer having a mounting surface, a first pad electrode, which is provided on the mounting surface and to which a first terminal of the inductor component is connected, and a first electrode, which is connected and is provided such that the first dielectric layer is positioned between the first electrode and the first pad electrode, at least part of the first electrode overlapping the first pad electrode when the mounting surface is viewed in a plan view, and the first pad electrode and the at least part of the first electrode form a first capacitor.

In the filter device, when the mounting surface is viewed in a plan view, the first electrode has a smaller area than the first pad electrode.

In the filter device, when the mounting surface is viewed in a plan view, the first electrode, in its entirety, overlaps the first pad electrode.

In the filter device, when the mounting surface is viewed in a plan view, in a case where an overlapping portion where the inductor component and the first electrode overlap is present, the overlapping portion overlaps the first pad electrode.

In the filter device, the substrate further includes a first wiring layer, which includes the first electrode and is provided such that the first dielectric layer is positioned between the first wiring layer and the first pad electrode, a second dielectric layer, which is provided such that the first wiring layer is positioned between the second dielectric layer and the first dielectric layer, a second wiring layer, which includes a reference electrode to which a reference potential is applied and is provided such that the second dielectric layer is positioned between the second wiring layer and the first wiring layer, and a first via, which penetrates the second dielectric layer and electrically connects the first electrode and the reference electrode.

In the filter device, when the mounting surface is viewed in a plan view, in a case where an overlapping portion where the inductor component and the first electrode overlap is present, the overlapping portion overlaps the first pad electrode.

In the filter device, the substrate further includes a second pad electrode, which is provided on the mounting surface and to which a second terminal of the inductor component is connected, and a wiring line that connects the first electrode and the second pad electrode, and the first capacitor and the inductor component form a parallel resonant circuit.

In the filter, the substrate further includes a second pad electrode, which is provided on the mounting surface and to which a second terminal of the inductor component is connected, and a second electrode, which is connected and is provided such that the first dielectric layer is positioned between the second electrode and the second pad electrode, at least part of the second electrode overlapping the second pad electrode when the mounting surface is viewed in a plan view, and the second pad electrode and the at least part of the second electrode form a second capacitor.

In the filter device, the substrate includes a plurality of the first vias.

In the filter device, the substrate further includes a third dielectric layer, which is positioned between the first dielectric layer and the first electrode.

In the filter device, the substrate further includes a second dielectric layer, which is provided such that the first dielectric layer is positioned between the second dielectric layer and the first pad electrode, and a second via, which penetrates the second dielectric layer and is the first electrode.

What is claimed is:

1. A filter device comprising:
   an inductor component that is a surface-mount device having a first terminal; and
   a substrate on which the inductor component is mounted, the substrate including
      a first dielectric layer having a mounting surface,
      a first pad electrode provided on the mounting surface, wherein the first terminal of the inductor component is connected to the first pad electrode, and
      a first electrode connected and provided such that the first dielectric layer is positioned between the first electrode and the first pad electrode, wherein at least part of the first electrode overlaps the first pad electrode when the mounting surface is viewed in a plan view,
   wherein the first pad electrode and the at least part of the first electrode form a first capacitor.

2. The filter device according to claim 1, wherein when the mounting surface is viewed in a plan view, the first electrode has a smaller area than the first pad electrode.

3. The filter device according to claim 2, wherein when the mounting surface is viewed in a plan view, an entire area of the first electrode overlaps the first pad electrode.

4. The filter device according to claim 2, wherein when the mounting surface is viewed in a plan view, if there is an overlapping portion between the inductor component and the first electrode-overlap, the overlapping portion overlaps the first pad electrode.

5. The filter device according to claim 1, wherein the substrate further includes
   a first wiring layer including the first electrode and provided such that the first dielectric layer is positioned between the first wiring layer and the first pad electrode,
   a second dielectric layer provided such that the first wiring layer is positioned between the second dielectric layer and the first dielectric layer,
   a second wiring layer including a reference electrode to which a reference potential is applied and provided such that the second dielectric layer is positioned between the second wiring layer and the first wiring layer, and at least one first via penetrating the second dielectric layer and electrically connecting the first electrode and the reference electrode.

6. The filter device according to claim 1, wherein when the mounting surface is viewed in a plan view, if there is an overlapping portion between the inductor component and the first electrode, the overlapping portion overlaps the first pad electrode.

7. The filter device according to claim 1, wherein the inductor component further has a second terminal, the substrate further includes a second pad electrode provided on the mounting surface, wherein the second terminal of the inductor component is connected to the second pad electrode, and a wiring line connecting the first electrode and the second pad electrode, and the first capacitor and the inductor component form a parallel resonant circuit.

8. The filter device according to claim 1, wherein the inductor component further has a second terminal, the substrate further includes a second pad electrode provided on the mounting surface, wherein the second terminal of the inductor component is connected to the second pad electrode, and a second electrode connected and provided such that the first dielectric layer is positioned between the second electrode and the second pad electrode, wherein at least part of the second electrode overlaps the second pad electrode when the mounting surface is viewed in a plan view, and the second pad electrode and the at least part of the second electrode form a second capacitor.

9. The filter device according to claim 5, wherein the at least one first via comprises a plurality of first vias.

10. The filter device according to claim 1, wherein the substrate further includes a third dielectric layer positioned between the first dielectric layer and the first electrode.

11. The filter device according to claim 1, wherein the substrate further includes a second dielectric layer provided such that the first dielectric layer is positioned between the second dielectric layer and the first pad electrode, and a second via penetrating the second dielectric layer and being the first electrode.

* * * * *